(12) United States Patent
Rodriguez et al.

(10) Patent No.: US 7,808,277 B2
(45) Date of Patent: Oct. 5, 2010

(54) BIDIRECTIONAL SIGNAL SEPARATION MODULE FOR A BUS CONVERTER

(75) Inventors: Juan Luis Lopez Rodriguez, Barcelona (ES); Marc Bautista Palacios, Sant Cugat del Valles (ES); Jonas Ingemar Astrom, Barcelona (ES)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 12/233,419

(22) Filed: Sep. 18, 2008

(65) Prior Publication Data

US 2010/0066409 A1 Mar. 18, 2010

(51) Int. Cl.
*H03K 19/0175* (2006.01)
*H03K 19/094* (2006.01)

(52) U.S. Cl. .......................................... 326/86; 326/62

(58) Field of Classification Search .................. 326/86, 326/62; 327/534; 361/119; 363/49
See application file for complete search history.

(56) References Cited

U.S. PATENT DOCUMENTS

| 4,797,582 | A | | 1/1989 | Nguyen et al. |
| 4,954,771 | A | * | 9/1990 | Spirin et al. ................. 324/767 |
| 6,014,040 | A | | 1/2000 | Tracy |
| 6,324,044 | B1 | * | 11/2001 | Teggatz et al. ............... 361/119 |
| 6,377,480 | B1 | * | 4/2002 | Sase et al. ..................... 363/49 |
| 6,628,160 | B2 | * | 9/2003 | Lin et al. ..................... 327/534 |
| 7,088,137 | B2 | | 8/2006 | Behrendt et al. |
| 7,248,095 | B2 | * | 7/2007 | Uratani et al. ............... 327/535 |
| 7,567,105 | B2 | * | 7/2009 | Trichy et al. ................. 327/170 |
| 2009/0284082 | A1 | * | 11/2009 | Mohammadian ............ 307/104 |

OTHER PUBLICATIONS

"P82B96 Dual bidirectional bus buffer," Product data sheet, Philips Semiconductors, Jan. 31, 2008.
Tracy, Phil et al., "AN255-2: I2C/SMBus Repeaters, Hubs and Expanders," Philips Semiconductors, Dec. 19, 2002; pp. 13-14.
"AN460: Using the P82B96 for Bus Interface," Philips Semiconductors, Feb. 14, 2001; p. 4.
Irazabal, Jean-Marc et al., "AN10146-02: I2C 2002-1A Evaluation Board," Philips Semiconductors, Feb. 26, 2003.
Irazabal, Jean-Marc et al., "DesignCon 2003 TecForum: I2C Bus Overview,"Philips Semiconductors, Jan. 27, 2003.

* cited by examiner

*Primary Examiner*—Vibol Tan
*Assistant Examiner*—Crystal L Hammond

(57) ABSTRACT

A bidirectional signal separation module includes a comparator having a first input node communicatively coupled to a bidirectional single-ended bus, a second input node communicatively coupled to a first voltage source, and an output node communicatively coupled to a unidirectional data transmission node; and a resistive network having a first node communicatively coupled to the second voltage source, a second node communicatively coupled to the bidirectional single-ended bus, a third node communicatively coupled to ground, and a fourth node communicatively coupled to an electronic switch. The electronic switch is configured to alternately couple the fourth node of the resistive network to the second voltage source or ground according to a voltage level on a unidirectional data receiving node.

15 Claims, 4 Drawing Sheets

BIDIRECTIONAL SIGNAL SEPARATION MODULE FOR A BUS CONVERTER

BACKGROUND

Buses are often used in the exchange of digital data among multiple electronic devices. Generally, data can be transmitted along a bus by altering the characteristics of one or more signals carried by the bus according to a protocol that is interpretable by other devices connected to the bus. For example, in some buses, data is transmitted electrically by altering the voltage present on one or more electrical conductors as a function of time according to the defining protocol.

Most bus protocols can be classified into one of two groups: a) single-ended buses and b) differential buses. Single-ended buses incorporate single-ended signaling, in which a single wire carries a varying voltage (with reference to a defined ground) that represents a digital signal. In differential buses, a digital data stream is sent via two complementary signals of varying voltage on two separate electrical conductors.

Single-ended signaling is often a good choice for transmitting signals over short distances, such as between components on a single circuit board, as little physical space on the board may be required to implement the bus. However, differential buses can be useful in transmitting data over longer distances, as differential signaling tends to be more resilient against noise and attenuation than single-ended signaling.

BRIEF DESCRIPTION OF THE DRAWINGS

The accompanying drawings illustrate various embodiments of the principles described herein and are a part of the specification. The illustrated embodiments are merely examples and do not limit the scope of the claims.

Throughout the drawings, identical reference numbers designate similar, but not necessarily identical, elements.

DETAILED DESCRIPTION

Figure 1:
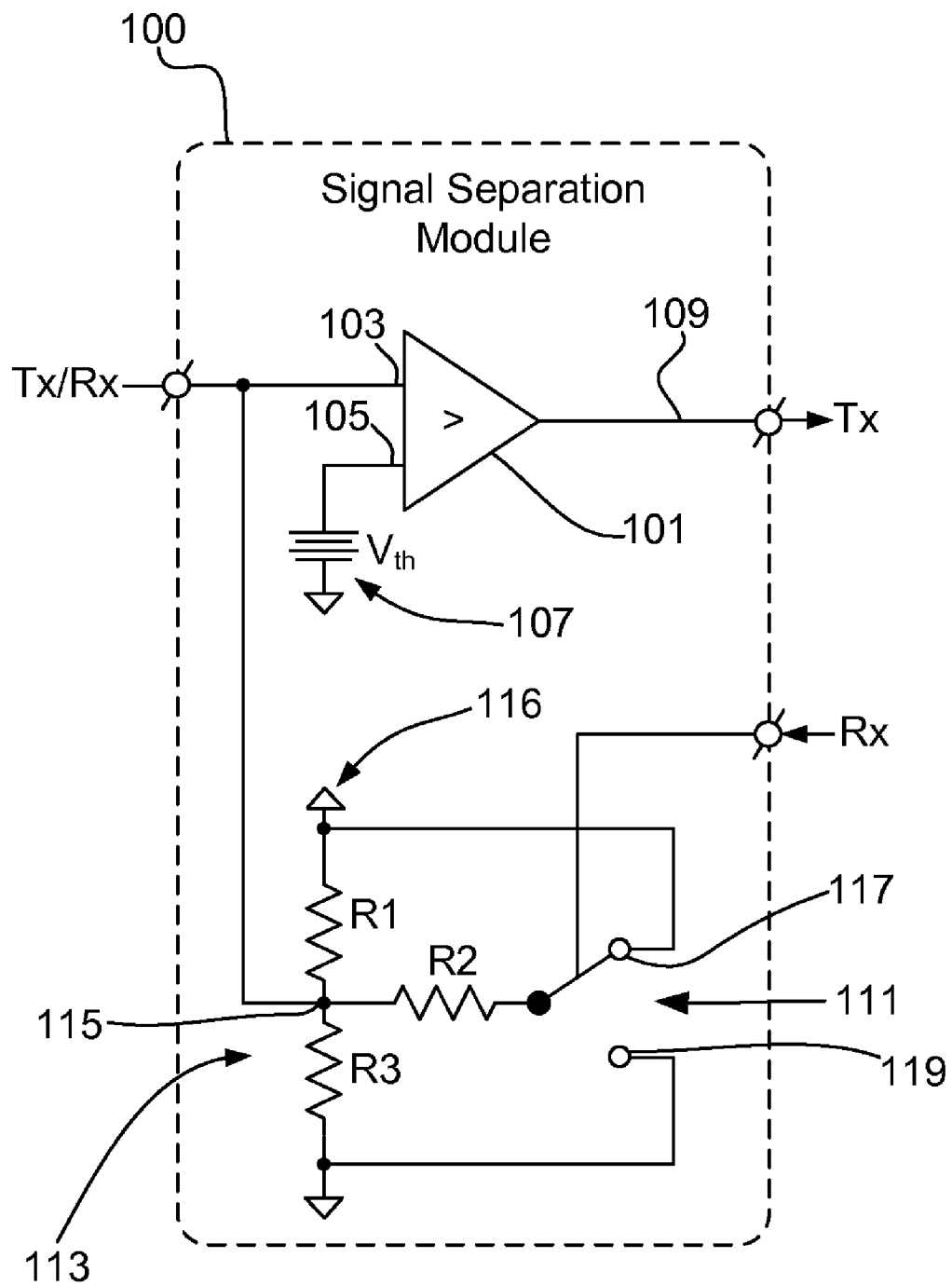
FIG. 1 is an electrical schematic diagram of an illustrative bidirectional signal separation module, according to one exemplary embodiment of the principles described herein.

As described above, data can be transmitted electrically over a bus by altering the voltage present on one or more electrical conductors as a function of time according to the defining protocol. Both single-ended and differential buses have their respective advantages and drawbacks.

In some cases, it may be desirable to improve the integrity of data signals intended for a single-ended bus. Such improvements in integrity may allow for increased transmission distances and more reliable data signals. One method of doing so involves converting a single-ended bus signal received from one component into a more resilient differential bus protocol and then back to a single-ended bus signal at a receiving component. Accordingly, this may involve the separation of a bidirectional bus signal into separate unidirectional data transmission and data receiving nodes, which can then be coupled to corresponding nodes in a differential signal transceiver.

Therefore, it may be desirable to provide a solution for converting a bidirectional single-ended data signal into separate unidirectional signals for use in a bus converter. It may further be desirable that this solution be adaptable for use with a variety of single-ended bus protocols, including low-noise and/or proprietary single-ended bus protocols.

To accomplish these and other goals, the present specification discloses a bidirectional signal separation module having a comparator configured to compare a voltage on a single-ended bus to a threshold voltage and output a digital value that is representative of the comparison at a unidirectional output node. An electronic switch is configured to selectively interconnect nodes in a resistive network to alternately output a digital high voltage or a digital low voltage to the single-ended bus according to a voltage present on a unidirectional input node. The unidirectional output node and the unidirectional input node may be coupled to respective Tx and Rx nodes of a differential transceiver to translate data between the single-ended bus and a differential bus.

As used in the present specification and in the appended claims, the term "single-ended signaling" refers to a type of digital data transmission in which an individual data signal is transmitted by varying the voltage of a single conductor with respect to a reference voltage, such as ground.

As used in the present specification and in the appended claims, the term "single-ended bus" refers to a type of bus that utilizes single-ended signaling to communicate data between two or more devices.

As used in the present specification and in the appended claims, the term "differential signaling" refers to a type of digital data transmission in which an individual data signal is transmitted by varying the voltage of two electrical conductors having complementary electrical signals with respect to a reference voltage, such as ground.

As used in the present specification and in the appended claims, the term "differential bus" refers to a type of bus that utilizes differential signaling to communicate data between two or more devices.

In the following description, for purposes of explanation, numerous specific details are set forth in order to provide a thorough understanding of the present systems and methods. It will be apparent, however, to one skilled in the art that the present systems and methods may be practiced without these specific details. Reference in the specification to "an embodiment," "an example" or similar language means that a particular feature, structure, or characteristic described in connection with the embodiment or example is included in at least that one embodiment, but not necessarily in other embodiments. The various instances of the phrase "in one embodiment" or similar phrases in various places in the specification are not necessarily all referring to the same embodiment.

The principles disclosed herein will now be discussed with respect to illustrative bidirectional signal separation modules, illustrative bidirectional single-ended to differential bus converters, and illustrative methods.

Illustrative Bidirectional Signal Separation Module

Referring now to FIG. 1, an illustrative bidirectional signal separation module (100) is shown. The signal separation module (100) may be used to separate a bidirectional single-ended signal from a bidirectional single-ended bus (Tx/Rx) into two unidirectional signals. In the present example, the two unidirectional signals are variable voltages measured at a transmission node (Tx) and a receiving node (Rx). The transmission node (Tx) may carry data from the bidirectional single-ended bus (Tx/Rx) to one or more other electronic components or buses, and the receiving node (Rx) may carry data from one or more other electronic components or buses to the bidirectional single-ended bus (Tx/Rx).

The illustrative bidirectional signal separation module (100) includes a comparator (101) having first and second input nodes (103, 105, respectively). The comparator (101) has circuitry configured to compare a voltage present on the first input node (103) to a voltage present on the second input node (105). In embodiments where a positive voltage represents a digital 1 on the single-ended bus (Tx/Rx), the comparator (101) may be configured to output a digital 1 or high signal if the voltage present at the first input node (103) is greater than the voltage present at the second input node (105). Likewise, in embodiments where a negative voltage represents a digital 1 on the single-ended bus (Tx/Rx), the comparator (101) may be configured to output a digital 1 or high signal if the voltage present at the first input node (103) is less than the voltage present at the second input node (105). Similarly, when a digital 0 or low signal is detected at the first input node (103), the comparator (101) is configured to output a digital 0 or low signal to the output node (109).

Comparators (101) are well-known in the art, and the comparator (101) may be implemented as a dedicated comparator circuit using transistors consistent with principles known in the art. For example, comparator type LM339 available from multiple manufacturers may be one suitable dedicated comparator circuit for use with the principles described herein. In alternative embodiments, the comparator (101) may be implemented using an operational amplifier (op-amp) as may suit a particular application of the principles described herein.

In the illustrative bidirectional signal separation module (100) shown in FIG. 1, the first input node (103) of the comparator (101) is communicatively coupled to the bidirectional single-ended bus (Tx/Rx) and the second input node (105) of the comparator (101) is communicatively coupled to a substantially constant voltage source (107). The voltage source (107) may include at least one of a battery, a voltage divider circuit, a voltage regulator, and/or a capacitor to establish a threshold voltage ($V_{th}$) for use as a standard against which voltages received from the bidirectional single-ended bus (Tx/Rx) are measured.

The comparator (101) may be used to determine whether voltages measured on the bidirectional single-ended bus (Tx/Rx) with respect to time correspond to transmitted digital 1's or 0's. As such, the threshold voltage ($V_{th}$) maintained by the voltage source (107) may be chosen according to a bus protocol used by the bidirectional single-ended bus (Tx/Rx) such that voltages higher than the threshold voltage ($V_{th}$) can be logically construed as representing a bit having a value of 1 and voltages lower than the threshold voltage ($V_{th}$) can be logically construed as representing a bit having a value of 0. Examples of suitable single-ended bus protocols that may be used with the bidirectional signal separation module (100) of the present specification include, but are not limited to, standard I²C, non-standard I²C, 1-Wire, I²S, custom or nonstandard single-ended bus protocols, and combinations thereof.

Thus, by comparing received voltage levels to the threshold voltage ($V_{th}$), the voltage at the output node (109) of the comparator (101) can be representative of incoming bits being transmitted by the bidirectional signal.

Depending on the bus protocol used by the bidirectional single-ended bus (Tx/Rx), a single value for the threshold voltage ($V_{th}$) may be used with the comparator (101) to correctly distinguish between digital 1's and 0's on the bidirectional single-ended bus (Tx/Rx) for a number of different protocols. Additionally, in certain embodiments the voltage source (107) may be adjustable to selectively change the value of the threshold voltage ($V_{th}$) to accommodate different bus protocols.

Furthermore, the high and low voltage levels output by the comparator (101) and corresponding to digital 1's and 0's, respectively, may, in certain embodiments, be different from the voltage levels used by the bidirectional single-ended bus (Tx/Rx). By way of example and not limitation, the output voltage levels can be configured to suit a particular application of the principles described herein by selecting a comparator (101) capable of outputting the desired voltage levels for digital 1's and 0's and providing the comparator with a supply voltage (i.e. Vdd or V+) representative of the desired output voltage level for a digital 1.

As shown in FIG. 1, the illustrative bidirectional signal separation module (100) also includes an electronic switch (111) and a resistive network (113). The electronic switch (111) and resistive network (113) may be used to alter the voltage level on the bidirectional single-ended bus (Tx/Rx) according to bits received from the unidirectional receiving node (Rx).

By way of example and not limitation, the resistive network (113) shown in FIG. 1 includes a T-network of three resistors (R1, R2, R3). Each of the resistors (R1, R2, R3) in the resistive network (113) is communicatively coupled to a common node (115). A first resistor (R1) in the network (113) is arranged such that a first node of R1 is communicatively coupled to a power rail (116) (e.g. Vdd or V+) and a first terminal (117) of the electronic switch (111), and a second node of R1 is communicatively coupled to the common node (115). A second resistor (R2) in the network (113) is arranged such that a first node of R2 is communicatively coupled to the unidirectional receiving node (Rx) and the control node for the electronic switch (111), and a second node of R2 is communicatively coupled to the common node (115). A third resistor (R3) in the network (113) is arranged such that a first node of R3 is communicatively coupled to ground and a second terminal (119) of the electronic switch (111), and a second node of R3 is communicatively coupled to the common node (115).

The common node (115) of the resistive network (113) in the present example is communicatively coupled to the bidirectional single-ended bus (Tx/Rx) such that bits may be written to the bidirectional single-ended bus (Tx/Rx) by selectively altering the voltage of the common node (115) in the resistive network (113). This may be done by switching the electronic switch (111) between terminals (117, 119) according to the digital high and low voltages present on the unidirectional receiving node (Rx) to selectively place the bidirectional single-ended bus (Tx/Rx) in a high or low state. The electronic switch (111) may be configured to switch to the first terminal (117) if a high voltage is received at a control node from the unidirectional receiving node (Rx) and to the second terminal (119) if a low voltage is received at the control node from the unidirectional receiving node (Rx).

The electronically controlled switch (111) may be configured such that the switching threshold voltage for the electronically controlled switch (111) is higher than what can be construed as a low voltage (digital 0) in the unidirectional receiving node (Rx) such that the electronically controlled switch (111) is only switched to the first terminal (117) when a digital 1 is present on the unidirectional receiving node (Rx). Conversely, the electronically controlled switch (111)

will be switched to the second terminal when a digital 0 is present on the unidirectional receiving node (Rx).

The electronically controlled switch (111) may have a minimum switching speed that is at least as fast as the rate at which data is transmitted from the unidirectional receiving node (Rx) to the bidirectional single-ended bus (Tx/Rx). In certain embodiments, the electronically controlled switch (111) may have a minimum switching speed that is significantly faster than the data rate. Furthermore, the electronically controlled switch (111) may include at least one transistor. In certain embodiments, the electronically controlled switch (111) may include an analog multiplexer.

In certain embodiments, it may be desirable for R2 to have a significantly smaller resistivity than R1 and R3. This may allow for greater precision in switching between high and low logic levels on the bidirectional single-ended bus (Tx/Rx).

For illustrative purposes only, the operation of the electronically controlled switch (111) and resistive network (113) will now be briefly summarized in the context of resistors R1, R2, and R3 having assumed respective values of 1 kΩ, 50Ω, and 1 kΩ. Additionally, it will be assumed that the power rail (116) provides a voltage of 5V, which corresponds to a digital 1 on the bidirectional single-ended bus (Tx/Rx).

Under these assumptions, if a digital 1 is received from the unidirectional receiving node (Rx) at the control node for the electronically controlled switch (111), the electronically controlled switch (111) will switch to the first terminal (117) such that the second node of R2 is communicatively coupled to the second node of R1 and the power rail (116). This, in effect, puts R1 and R2 in a parallel configuration between the power rail (116) and the common node (115) of the resistive network (113). As a 1 kΩ resistor (R1) in parallel with a 50Ω resistor is equivalent to a 47.6 Ω resistor, a voltage divider circuit is created in which the voltage at the common node (115) is approximately (5*1000)/(1000+47.6)=4.77V. This 4.77V is placed on the bidirectional single-ended bus (Tx/Rx), where it represents a digital 1.

Maintaining these assumptions, if a digital 0 is received from the unidirectional receiving node (Rx) at the control node for the electronically controlled switch (111), the electronically controlled switch (111) will switch to the second terminal (119) such that the second node of R3 is communicatively coupled to the second node of R1 and ground. This would put R2 and R3 in a parallel configuration between the common node (115) and ground, resulting in a voltage divider in which the voltage at the common node (115) is approximately (5*47.6)/(1000+47.6)=0.23V. As the common node (115) is communicatively coupled to the bidirectional single-ended bus (Tx/Rx), the 0.23V is placed on the bus (Tx/Rx) where it represents a digital 0.

Again, the voltage levels used to distinguish between high and low logic levels (i.e. digital 1's and 0's) in the bidirectional single-ended bus (Tx/Rx) need not necessarily be identical to those used in the unidirectional receiving node (Rx). By adjusting each of the resistor values in the resistive network (113), the voltage of the power rail (116), and the threshold switching control voltage for the electronically controlled switch (111), different protocols can be accommodated by the illustrative bidirectional signal separation module (100) as may suit the specifications of a particular application of the principles described herein.

Furthermore, it should be understood that data signals arriving at the unidirectional receiving node (Rx) are transmitted by the illustrative signal separation module (100) to the bidirectional single-ended bus (TX/Rx), but will not be retransmitted to the unidirectional transmission node (Tx). As a result of this feature, positive feedback between the illustrative signal separation module (100) and device(s) coupled to the unidirectional transmission node (Tx) and the unidirectional receiving node (Rx) may be eliminated, thereby preventing a voltage lockup of the illustrative signal separation module (100) and preserving signal integrity.

To ensure that the signals arriving to the unidirectional receiving node (Rx) are not retransmitted to the unidirectional transmission node (Tx), the threshold voltage ($V_{th}$) of the comparator (101) and the resistor values in the resistive network (113) may be selected taking into account the voltage levels that devices connected to the bidirectional single-ended bus (Tx/Rx) will accept as a logical 0 and a logical 1 when receiving data and provide as a digital 0 and a digital 1 when transmitting data. Specifically, the resistor values in the resistive network (113) may be selected such that a digital 1 output at the common node (115) is represented by a voltage high enough to be read as a digital 1 by the devices connected to the bidirectional single-ended bus (Tx/Rx) but lower than the threshold voltage ($V_{th}$) for the comparator (101).

By way of example and not limitation, an example using a CMOS 3.0V power rail system will be described. Supposing that the device(s) connected to the bidirectional single-ended bus (Tx/Rx) are configured to interpret received voltages higher than 2.0V as a digital 1 and to transmit a digital 1 at a voltage higher than 2.8V, the threshold voltage for the comparator (101) could be set to about 2.6V and the resistive network (113) configured such that a digital 1 is output to the bidirectional single-ended bus (Tx/Rx) by establishing a voltage level of about 2.2V at the common node (115). In this way, digital 1's output to the bidirectional single-ended bus (Tx/Rx) will not be retransmitted to the unidirectional transmission node (Tx) by the comparator (101).

It will also be noted that the state of the illustrative signal separation module (100) (i.e. whether the bidirectional signal separation module (100) is transmitting data from the bidirectional single-ended bus (Tx/Rx) to the unidirectional transmission node (Tx) or receiving data from the unidirectional receiving node (Rx) and placing the received data on the bidirectional single-ended bus (Tx/Rx)) may be determined by the protocols governing bus access used by different electronic components communicating via the signal separation module (100). In other words, the bidirectional signal separation module (100) is essentially passive in that it can immediately switch data flow from one direction to another without requiring additional configuration. As the bus access protocol of the bidirectional single-ended bus (Tx/Rx) will generally not permit the transmission of data in two directions at any given moment, the signal separation module (100) will generally not be subject to data corruption or loss caused by the attempted transmission of data in two directions simultaneously.

Illustrative Bidirectional Single-ended to Differential Bus Converters

Figure 2:
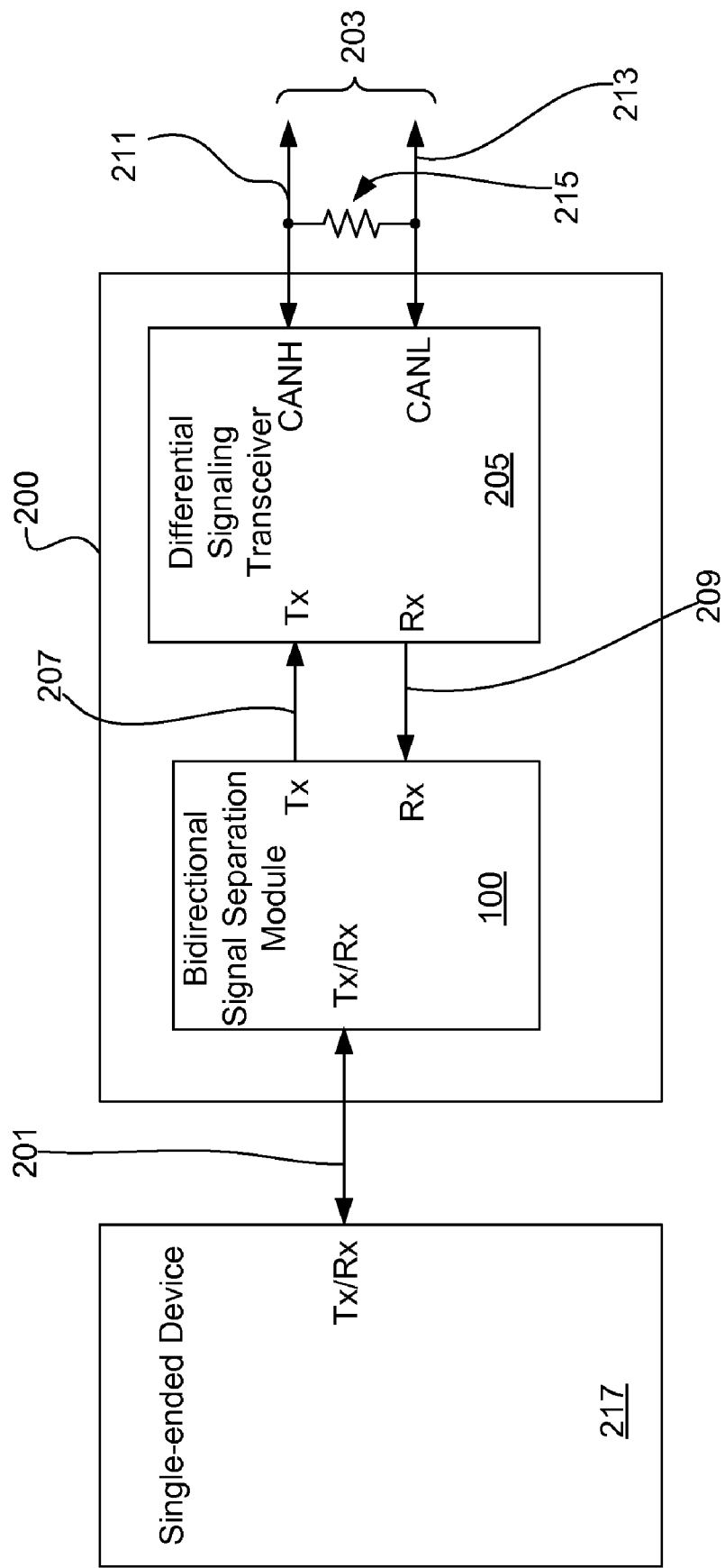
FIG. 2 is a block diagram of an illustrative bidirectional single-ended to differential bus converter, according to one exemplary embodiment of the principles described herein.

Referring now to FIG. 2, a block diagram of an illustrative bidirectional single-ended to differential bus converter (200) is shown. The single-ended to differential bus converter (200) may be used to convert a single-ended bus (201) to a more resilient differential bus (203) to improve data transmission range, improve signal integrity, and/or to interface between electronic components configured to interact with different types of buses.

The bus converter (200) includes a bidirectional signal separation module (100) consistent with the principles described with respect to FIG. 1. The bidirectional signal separation module (100) is configured to forward data received from a bidirectional single-ended bus (201) at a Tx/Rx node on a unidirectional transmission node (Tx) and to forward data received at a unidirectional receiving node (Rx) to the bidirectional single-ended bus (201). The unidirectional transmission node (Tx) and the unidirectional receiving node (Rx) are communicatively coupled to corresponding Tx and Rx nodes in a differential signaling transceiver (205) by electrical conductors (207, 209).

The differential signaling transceiver (205) is configured to convert data received from the unidirectional transmission node (Tx) of the bidirectional signal separation module (100) to differential signaling and place the data on the differential bus (203). Additionally, the differential signaling transceiver (205) may receive data from the differential bus (203) and output the data to the unidirectional receiving node (Rx) of the bidirectional signal separation module (100). By way of example and not limitation, the differential signaling transceiver (205) is configured to transmit to, and receive data from, a differential bus conforming to the controller-area network bus (CAN bus) protocol through a CANH line (211) and a CANL line (213) having a resistor (215) disposed therebetween. Alternatively, the differential signaling transceiver (205) may conform to any other differential bus protocol that may suit a particular application of the principles described herein.

Such differential signaling transceivers (205) are well-known in the art and are available in many different forms. One example of the many suitable differential signaling transceivers that may be used in conjunction with the principles described above is the TJA1050 chip available from NXP Semiconductors. Other examples of suitable differential signaling transceivers include, but are not limited to, other commercially available differential bus transceivers (e.g. L9615 manufactured by ST Microelectronics), custom-designed differential signaling transceivers, microcontrollers having differential signaling transceivers integrated therein, and programmable processors that are programmed to function as differential signaling transceivers.

As shown in FIG. 2, a single-ended device (217) may be coupled to the bus converter (200) of the present example through mutual connections to the bidirectional single-ended bus (201). Data transmitted by the single-ended device (217) to the bidirectional single-ended bus (201) may be converted to differential signaling and transmitted on the differential bus (203) by the bidirectional signal separation module (100) and the differential signaling transceiver (205) in the bus converter (200). Likewise, data received from the differential bus (203) may be transmitted to the single-ended device (217) over the bidirectional single-ended bus (201) using the differential signaling transceiver (205) and the bidirectional signal separation module (100) in the bus converter (200).

Figure 3:
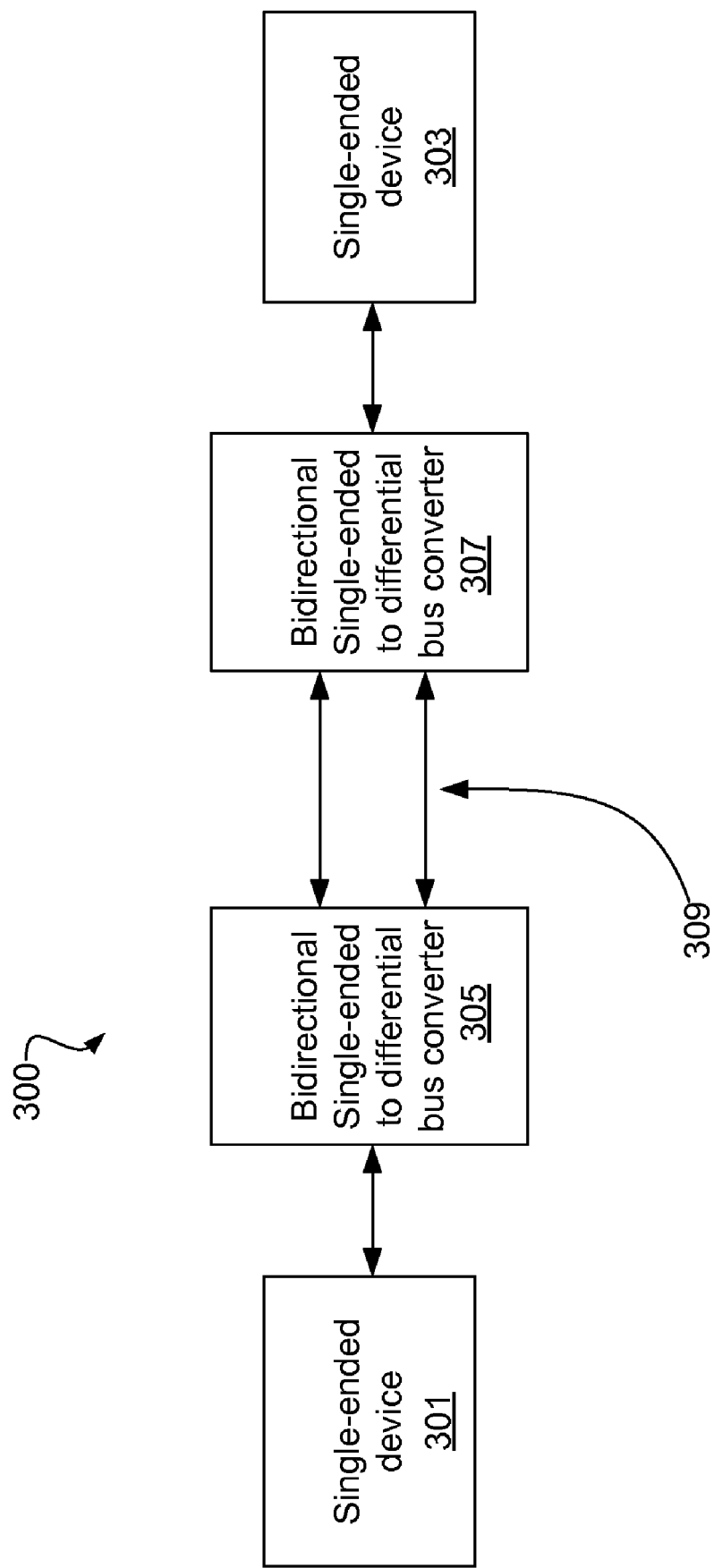
FIG. 3 is a block diagram of an illustrative bus system with improved signal integrity for single-ended signaling devices, according to one exemplary embodiment of the principles described herein.

Referring now to FIG. 3, a block diagram of an illustrative bus system (300) with improved signal integrity for single-ended devices (301, 303) is shown. In the illustrative system (300), each single-ended device (301, 303) is communicatively coupled to a bidirectional single-ended to differential bus converter (305, 307, respectively) consistent with the principles described with respect to FIGS. 1-2. A differential bus (309), such as (but not limited to) a CAN bus, may communicatively couple the bus converters (305, 307) such that data transmitted between the single-ended devices (301, 303) is converted from single-ended signaling to differential signaling and back to single-ended signaling, thereby improving signal integrity over longer distances and ensuring compatibility with the single-ended devices (301, 303).

Illustrative Method

Figure 4:
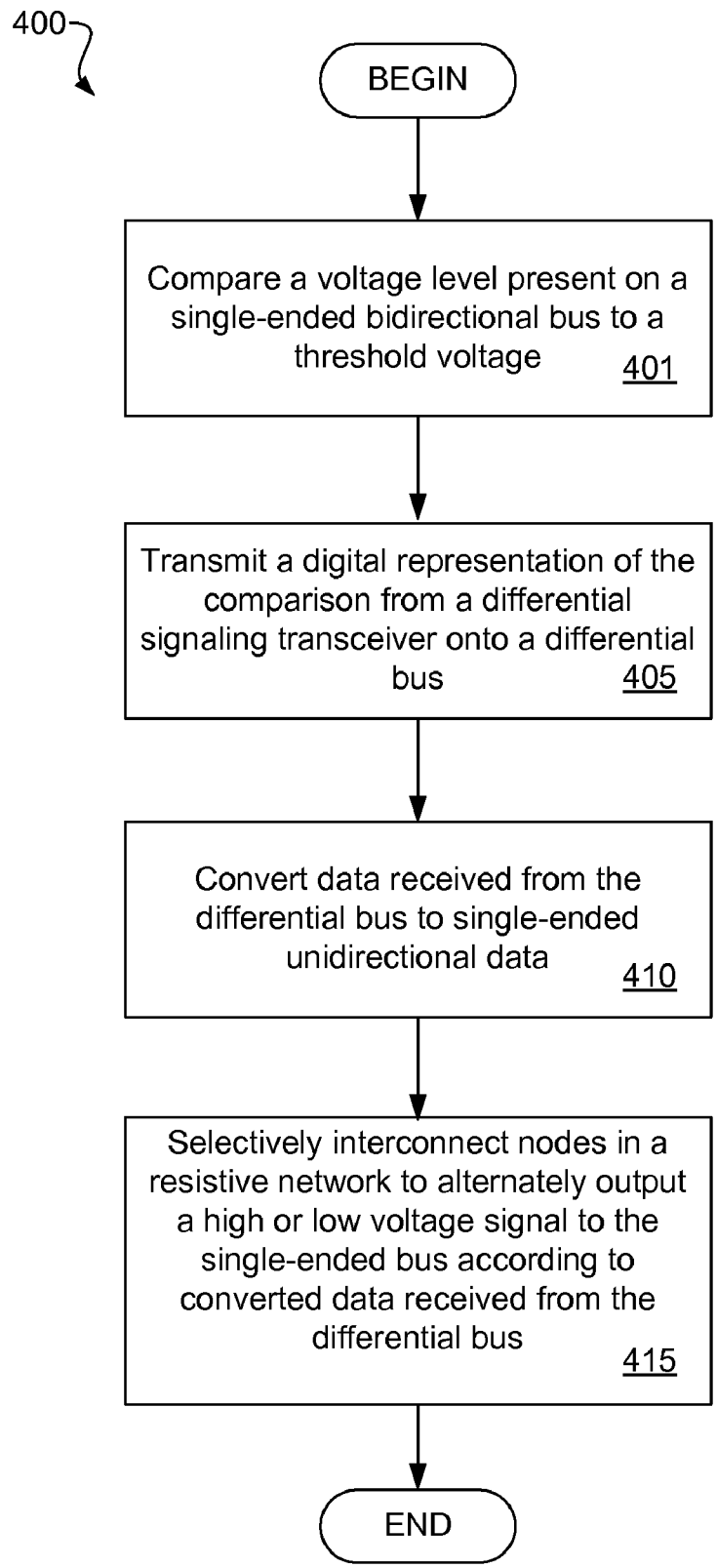
FIG. 4 is a flowchart of an illustrative method of transmitting data between a bidirectional single-ended bus and a bidirectional differential bus, according to one exemplary embodiment of the principles described herein.

Referring now to FIG. 4, a flowchart of an illustrative method (400) of transmitting data between a bidirectional single-ended bus and a bidirectional differential bus is shown. In certain embodiments, the method (400) may be performed by one or more components of a single-ended to differential bus converter (200, FIG. 2)

The method (400) includes comparing (step 401) a voltage level present on a single-ended bidirectional bus to a threshold voltage. This comparison may be performed by a digital comparator, and the threshold voltage may be selected according to a particular bus protocol used in the single-ended bidirectional bus. A differential signaling transceiver in communication with the digital comparator may then transmit (step 405) a digital representation of the comparison onto a differential bus.

When data is received from the differential bus, the data can be converted (step 410) to single-ended unidirectional data. Then, nodes in a resistive network can be selectively interconnected (step 415) to alternately output a high or low voltage signal to the single-ended bus according to the converted data received from the differential bus. Selectively interconnecting (step 415) the nodes in the resistive network may include selectively activating an electronically controlled switch based on a voltage received in the converted data from the differential bus and a threshold voltage in the electronically controlled switch, consistent with the principles described with reference to FIG. 1.

The preceding description has been presented only to illustrate and describe embodiments and examples of the principles described. This description is not intended to be exhaustive or to limit these principles to any precise form disclosed. Many modifications and variations are possible in light of the above teaching.

What is claimed is:

1. A bidirectional signal separation module, comprising:
a comparator comprising a first input node communicatively coupled to a bidirectional single-ended bus, a second input node communicatively coupled to a first voltage source, and an output node communicatively coupled to a unidirectional data transmission node; and
a resistive network comprising a first node communicatively coupled to a second voltage source, a second node communicatively coupled to said bidirectional single-ended bus, a third node communicatively coupled to ground, and a fourth node communicatively coupled to an electronic switch;
wherein said electronic switch is configured to alternately couple said fourth node of said resistive network to said second voltage source or ground according to a voltage level on a unidirectional data receiving node.

2. The bidirectional signal separation module of claim 1, wherein said comparator is configured to output a digital 1 to said unidirectional data transmission node if a voltage at said first input node is greater than a voltage at said second input node.

3. The bidirectional signal separation module of claim 1, wherein a voltage output by said resistive network to said bidirectional single-ended bus is less than a voltage provided by said first voltage source to said comparator when said fourth node of said resistive network is coupled to said second voltage source.

4. The bidirectional signal separation module of claim 1, wherein said second voltage source is configured to provide a voltage greater than a logic threshold voltage for a digital 1 signal on said bidirectional single-ended bus.

5. A system for transmitting data between a bidirectional single-ended bus and a bidirectional differential bus, comprising:
- a bidirectional signal separation module communicatively coupled to said single-ended bus, said bidirectional signal separation module further comprising:
  - a comparator configured to compare a voltage on said bidirectional single-ended bus to a threshold voltage and output a digital value representative of said comparison at a unidirectional output node;
  - an electronic switch configured to selectively interconnect nodes of a resistive network to alternately output a digital high voltage or a digital low voltage to said bidirectional single-ended bus according to a voltage level on a unidirectional input node; and
- a differential transceiver configured to transmit data from said unidirectional output node over said differential bus and to transmit data received from said differential bus to said unidirectional input node.

6. The system of claim 5, wherein said resistive network comprises
a first node communicatively coupled to a voltage source, a second node communicatively coupled to said bidirectional single-ended bus, a third node communicatively coupled to ground, and a fourth node communicatively coupled to a control node of said electronic switch.

7. The system of claim 6, wherein said electronic switch is configured to alternately connect said fourth node of said resistive network with said voltage source or ground according to said voltage on said unidirectional input node.

8. The system of claim 7, wherein said digital high voltage output from said resistive network to said bidirectional single-ended bus is less than said threshold voltage of said comparator.

9. The system of claim 5, wherein said electronic switch comprises an analog multiplexer.

10. The system of claim 6, wherein said voltage source is configured to provide a voltage corresponding to a digital 1 on said single-ended bus.

11. The system of claim 5, wherein said resistive network comprises a T-network of resistors.

12. A method, comprising:
- comparing a voltage level present on a bidirectional single-ended bus to a threshold voltage;
- transmitting a digital representation of said comparison from a differential signaling transceiver onto a differential bus;
- receiving data from said differential bus through said differential signaling transceiver; and
- selectively interconnecting nodes in a resistive network to alternately output a high or low voltage signal to said bidirectional single-ended bus according to data received from said differential bus.

13. The method of claim 12, further comprising converting said data received from said differential bus into single-ended unidirectional data.

14. The method of claim 13, wherein said selectively interconnecting nodes in a resistive network is performed by an electronic switch configured to receive said single-ended unidirectional data.

15. The method of claim 12, wherein said high voltage signal output to said single-ended bus is less than said threshold voltage.

* * * * *